United States Patent
Smalc et al.

(10) Patent No.: US 7,666,270 B1
(45) Date of Patent: *Feb. 23, 2010

(54) HEAT SPREADER FOR DISPLAY PANEL

(75) Inventors: Martin David Smalc, Parma, OH (US); Julian Norley, Chagrin Falls, OH (US); Joseph Paul Capp, Strongsville, OH (US); Timothy Clovesko, North Olmsted, OH (US)

(73) Assignee: GrafTech International Holdings Inc., Parma, OH (US)

( * ) Notice: Subject to any disclaimer, the term of this patent is extended or adjusted under 35 U.S.C. 154(b) by 75 days.

This patent is subject to a terminal disclaimer.

(21) Appl. No.: 11/176,959

(22) Filed: Jul. 7, 2005

Related U.S. Application Data

(63) Continuation-in-part of application No. 10/685,103, filed on Oct. 14, 2003, now Pat. No. 7,138,029.

(51) Int. Cl.
- B29C 65/48 (2006.01)
- B32B 37/00 (2006.01)
- C09K 19/52 (2006.01)
- B32B 9/00 (2006.01)
- B32B 33/00 (2006.01)
- B32B 5/16 (2006.01)

(52) U.S. Cl. .................... 156/249; 156/289

(58) Field of Classification Search .............. 156/247, 156/249, 289; 428/40.1, 141, 323, 408, 143; 313/40, 45, 46, 493, 581, 582, 587, 634
See application file for complete search history.

(56) References Cited

U.S. PATENT DOCUMENTS

| | | | |
|---|---|---|---|
| 3,404,061 A | 10/1968 | Shane et al. | 161/125 |
| 3,981,427 A | 9/1976 | Brookes | 228/122 |
| 4,355,684 A | 10/1982 | Caines | 165/154 |
| 4,895,713 A | 1/1990 | Greinke et al. | 423/448 |
| 5,255,109 A * | 10/1993 | Klein | 349/84 |
| 5,766,740 A * | 6/1998 | Olson | 428/209 |
| 5,831,374 A | 11/1998 | Morita et al. | 313/46 |
| 5,902,762 A | 5/1999 | Mercuri et al. | 501/99 |
| 6,046,294 A * | 4/2000 | Achenbach et al. | 528/15 |
| 6,245,400 B1 | 6/2001 | Tzeng et al. | 428/40.1 |
| 6,407,922 B1 | 6/2002 | Eckblad et al. | |
| 6,482,520 B1 | 11/2002 | Tzeng | 428/408 |

(Continued)

OTHER PUBLICATIONS

Japan Unexamined Patent Publication Hei 10-56114, JP1998056114A, Feb. 24, 1998.

(Continued)

*Primary Examiner*—Philip C Tucker
*Assistant Examiner*—Sing P Chan
(74) *Attorney, Agent, or Firm*—Waddey & Patterson, P.C.; James R. Cartiglia

(57) ABSTRACT

The invention presented is a method for applying heat spreaders to a plurality of display panels, including (a) providing a plurality of heat spreader composites, each of which comprises a heat spreader material having an adhesive thereon and a release material positioned such that the adhesive is sandwiched between the heat spreader material and the release material; (b) removing the release material from a plurality of the composites; and (c) applying at least one of the composites to each of the plurality of display panels each such that the adhesive adheres the heat spreader material to the display panel.

17 Claims, 1 Drawing Sheet

U.S. PATENT DOCUMENTS

| | | |
|---|---|---|
| 6,737,790 B2 | 5/2004 | Seki |
| 6,816,371 B2 * | 11/2004 | Agata et al. ............... 361/687 |
| 6,835,453 B2 * | 12/2004 | Greenwood et al. ......... 428/343 |
| 7,138,029 B2 * | 11/2006 | Norley et al. ............... 156/249 |
| 2002/0142165 A1 * | 10/2002 | Norley et al. ............... 428/408 |
| 2004/0124772 A1 | 7/2004 | Chen |
| 2004/0257307 A1 | 12/2004 | Bae et al. |
| 2005/0046618 A1 | 3/2005 | Kim et al. |
| 2005/0062382 A1 | 3/2005 | Kim et al. |
| 2005/0068738 A1 | 3/2005 | Kim et al. |
| 2005/0088097 A1 | 4/2005 | Bae et al. |
| 2005/0122019 A1 | 6/2005 | Bae |
| 2005/0174054 A1 | 8/2005 | Kang et al. |
| 2005/0194900 A1 | 9/2005 | Kim et al. |
| 2008/0085389 A1 * | 4/2008 | Norley et al. ............... 428/40.1 |

OTHER PUBLICATIONS

Japan Unexamined Patent Publication Hei 11-179830, JP1999179830A, Jul. 6, 1999.

* cited by examiner

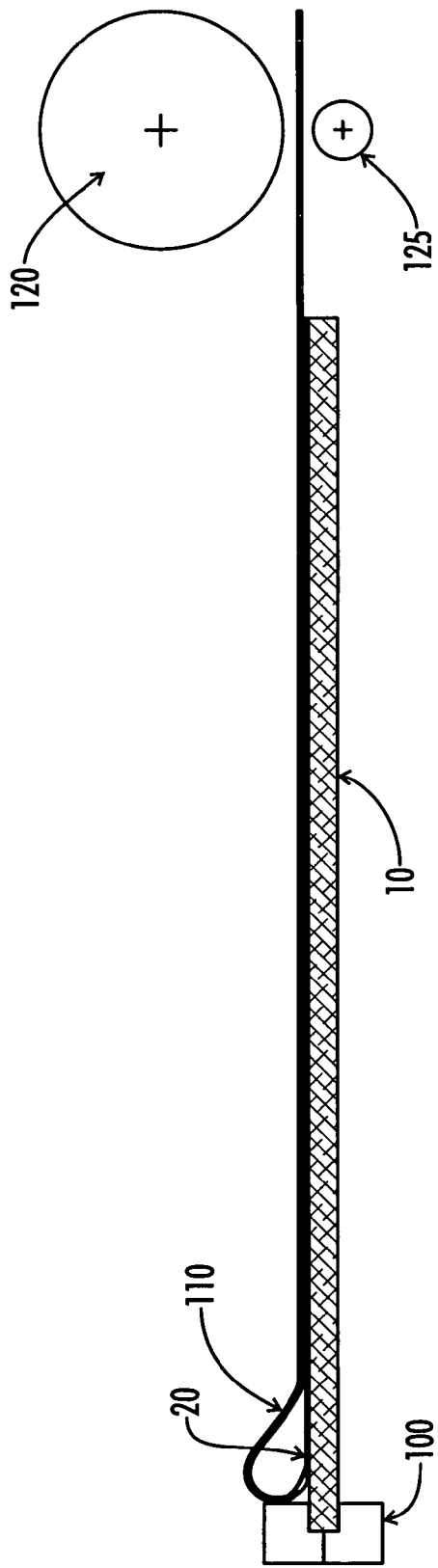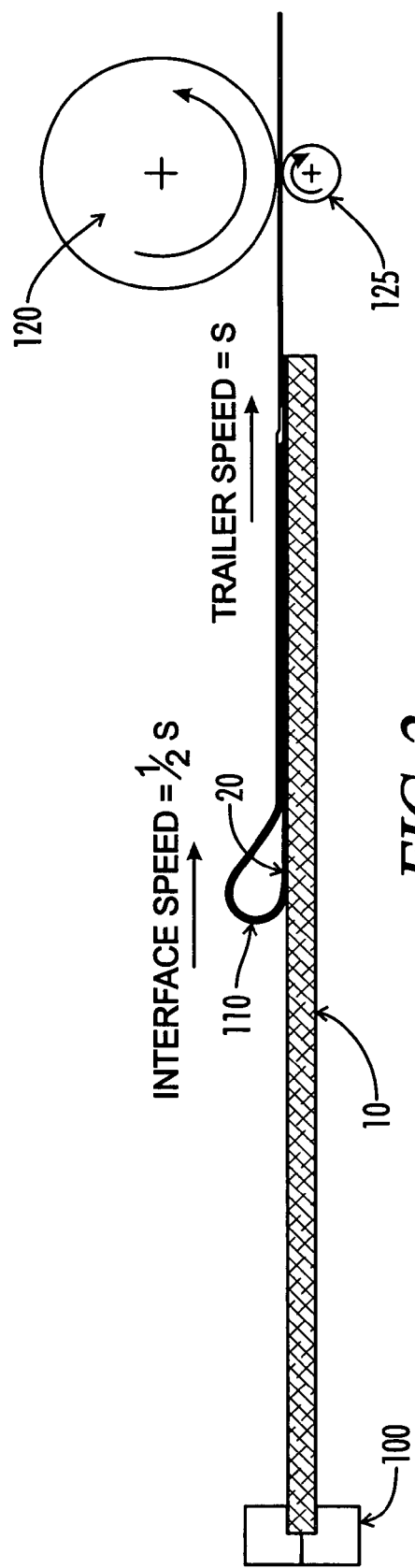

HEAT SPREADER FOR DISPLAY PANEL

RELATED APPLICATION

This application is a continuation-in-part of and commonly assigned U.S. Patent Application having Ser. No. 10/685,103 filed in the names of Norley, Smalc, Capp and Clovesko on Oct. 14, 2003, entitled "Heat Spreader for Plasma Display Panel," now U.S. Pat. No. 7,138,029 the disclosure of which is incorporated herein by reference.

TECHNICAL FIELD

The present invention relates to a heat spreader useful for a display panel, especially a plasma display panel, and a method of applying the inventive heat spreader to a display panel.

BACKGROUND OF THE ART

A plasma display panel is a display apparatus which contains a plurality of discharge cells, and is constructed to display an image by applying a voltage across electrodes discharge cells thereby causing the desired discharge cell to emit light. A panel unit, which is the main part of the plasma display panel, is fabricated by bonding two glass base plates together in such a manner as to sandwich a plurality of discharge cells between them.

In a plasma display panel, the discharge cells which are caused to emit light for image formation generate heat and each thus constitutes a source of heat, which causes the temperature of the plasma display panel as a whole to rise. The heat generated in the discharge cells is transferred to the glass forming the base plates, but heat conduction in directions parallel to the panel face is difficult because of the properties of the glass base plate material.

In addition, the temperature of a discharge cell which has been activated for light emission rises markedly, while the temperature of a discharge cell which has not been activated does not rise as much. Because of this, the panel face temperature of the plasma display panel rises locally in the areas where an image is being generated, accelerating thermal deterioration of affected discharge cells, unless some heat sinking measures are taken.

Further, since the temperature difference between activated and nonactivated discharge cells can be high, and, in fact, the temperature difference between discharge cells generating white light and those generating darker colors also can be high, a stress is applied to the panel unit, causing the conventional plasma display panel to be prone to cracks and breakage.

When the voltage to be applied to the electrodes of discharge cells is increased, the brightness of the discharge cells increases but the amount of heat generation in such cells also increases. Thus, those cells having large voltages for activation become more susceptible to thermal deterioration and tend to exacerbate the breakage problem of the panel unit of the plasma display panel.

The use of graphite films or sheets as thermal interface materials for plasma display panels has been suggested by, for example, Morita, Ichiyanagi, Ikeda, Nishiki, Inoue, Komyoji and Kawashima in U.S. Pat. No. 5,831,374. In addition, the heat spreading capabilities of sheets of compressed particles of exfoliated graphite has also been recognized. Indeed, such materials are commercially available from Advanced Energy Technology Inc. of Lakewood, Ohio as its eGraf® 700 class of materials.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional such as thermal and electrical conductivity.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material thus produced has excellent flexibility, good strength and a high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cc to about 2.0 g/cc.

The flexible graphite sheet material exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

One drawback to the use of graphite sheets as heat spreaders for plasma display panels lies in the plasma display panel manufacturing process. More specifically, plasma display panels are produced in very high volumes, and the process for applying a graphite heat spreader to the plasma display panel need be such that a bottleneck in the manufacturing process is not created. Moreover, a means of adhering the graphite spreader to the panel is needed to avoid having the graphite spreader fall off during the manufacturing process and to ensure good thermal contact between the graphite spreader and the plasma display panel without the requirement of high pressure application of the spreader; however, the attachment method must not have a significant deleterious impact on the thermal performance of the heat spreader.

One method for attaching a graphite heat spreader to a plasma display panel is by use of an adhesive applied to the graphite. U.S. Pat. No. 6,245,400 to Tzeng, Getz and Weber describes a method for producing a release-lined pressure sensitive adhesive flexible graphite sheet article, wherein the release liner is easily removed from the graphite sheet without delaminating the graphite. Graphite sheet has a relatively low cohesive strength and removing the release liner without delaminating the graphite is a significant challenge. A key component of the Tzeng et al. patent is the use of a primer coating applied to the graphite sheet prior to applying the pressure sensitive adhesive. The disadvantage of this approach is the need for an additional coating step, which increases manufacturing complexity and cost.

Thus, a method for producing a release lined pressure sensitive adhesive flexible graphite sheet without the use of a primer coating is needed for use as a heat spreader for plasma display panels. Furthermore, this method should allow for the achievement of very high speed of release of the release liner from the adhesive-coated graphite sheet, without delamination of the graphite, and yet not create an undesirably high reduction of the thermal properties of the graphite heat spreader.

SUMMARY OF THE INVENTION

Accordingly, it is an object of the present invention to provide a method for applying heat spreaders to display panels in a high volume manufacturing process.

Another object of the present invention is to provide a heat spreader material which can be used in a high volume display panel manufacturing process.

Yet another object of the present invention is to provide a method for applying a heat spreader material to a heat source such as a display panel in a high volume manufacturing process where the application of the heat spreader does not create a bottleneck in the manufacturing process.

Another object of the present invention is to provide a heat spreader material which can be applied to a heat source or collection of heat sources such as a display panel and adhere with good thermal contact between the heat spreader and the display panel without the requirement of high pressure application of the spreader to achieve the desired thermal contact.

Still another object of the present invention is to provide a heat spreader material which can be applied to a heat source or collection of heat sources such as a display panel and adhere to the source without falling off during the assembly process.

A further object of the present invention is to provide a method for applying a heat spreader to a heat source or collection of heat sources such as a display panel which does not significantly impact the thermal performance of the heat spreader.

These objects and others which will be apparent to the skilled artisan upon reading the following description, can be achieved by providing a method for applying heat spreaders to a heat source, such as a plurality of display panels, where the method includes providing a plurality of heat spreader composites, each of which comprises a heat spreader material having an adhesive thereon and a release material positioned such that the adhesive is sandwiched between the heat spreader material and the release material; removing the release material from a plurality of the composites; and applying at least one of the composites to each of the plurality of display panels such that the adhesive adheres the heat spreader material to the display panel. In a preferred embodiment, the heat spreader composites do not include a primer layer for adhesion of the adhesive to the heat spreader material.

The release material and adhesive should each be selected to permit a predetermined rate of release of the release material without causing undesirable damage to the heat spreader material. In addition, the adhesive and release material should also provide an average release load of no greater than about 40 grams per centimeter (g/cm) at a release speed of about 1 meter/second (m/s). Indeed, the average release load should be no greater than about 20 g/cm, most preferably no greater than about 10 g/cm, at a release speed of about 1 m/s.

Furthermore, the adhesive should preferably achieve a minimum lap shear adhesion strength of at least about 125 g/cm$^2$, more preferably an average lap shear adhesion strength of at least about 700 g/cm$^2$.

In order to avoid unduly high thermal losses, the adhesive should result in an increase in through-thickness thermal resistance of the adhesive/heat spreader material combination of not more than about 100% and preferably not more than about 35% as compared to the heat spreader material itself. To meet the requirements of liner release speed, adhesion strength and thermal resistance, the adhesive thickness should be no greater than about 0.5 mils in thickness and most preferably between about 0.1 and about 0.25 mils in thickness.

The heat spreader material advantageously comprises graphite, especially at least one sheet of compressed particles of expanded graphite, which can be provided as a laminate comprising a plurality of sheets of compressed particles of expanded graphite.

Other and further objects, features and advantages of the present invention will be readily apparent to those skilled in the art upon a reading of the following disclosure when taken in conjunction with the accompanying drawings.

BRIEF DESCRIPTION OF THE DRAWINGS

FIG. 1 is a diagram of the high speed release test of Example 1.

FIG. 2 is a diagram of the high speed release test of Example 1, shown during testing.

DETAILED DESCRIPTION OF THE PREFERRED EMBODIMENT

Graphite is a crystalline form of carbon comprising atoms covalently bonded in flat layered planes with weaker bonds between the planes. In obtaining source materials such as the above flexible sheets of graphite, particles of graphite, such as natural graphite flake, are typically treated with an intercalant of, e.g. a solution of sulfuric and nitric acid, where the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The expanded (otherwise referred to as exfoliated) graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact.

Graphite starting materials for the flexible sheets suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions, and the like. Natural graphite is most preferred.

The graphite starting materials for the flexible sheets used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed.

Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalated graphite flake with the organic reducing agent, the blend can be exposed to temperatures in the range of 25° to 125° C. to promote reaction of the reducing agent and intercalated graphite flake. The heating period is up to about 20 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing (or "calendering") graphite worms into flexible graphite sheet. The resulting sheet therefore has higher area weight uniformity and greater tensile strength, even when the starting graphite particles are smaller than conventionally used. The lubricious additive is preferably a long chain hydrocarbon. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compression molded together into flexible sheets having small transverse openings that, unlike the original graphite flakes, can be formed and cut into various shapes, as hereinafter described.

Alternatively, the flexible graphite sheets of the present invention may utilize particles of reground flexible graphite sheets rather than freshly expanded worms. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls, but have not yet been impregnated with resin. Furthermore, the source material may be sheets or trimmed portions of sheets that have been impregnated with resin, but not yet cured, or sheets or trimmed portions of sheets that have been impregnated with resin and cured. The source material may also be recycled flexible graphite PEM fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh. It may be desirable to cool the flexible graphite sheet when it is resin-impregnated as it is being comminuted to avoid heat damage to the resin system during the comminution process.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

If the source material has been resin impregnated, then preferably the resin is removed from the particles. Details of the resin removal are further described below.

Once the source material is comminuted, and any resin is removed, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinafter described.

If the starting material has been impregnated with a resin, the resin should preferably be at least partially removed from the particles. This removal step should occur between the comminuting step and the re-expanding step.

In one embodiment, the removing step includes heating the resin containing regrind particles, such as over an open flame. More specifically, the impregnated resin may be heated to a temperature of at least about 250° C. to effect resin removal. During this heating step care should be taken to avoid flashing of the resin decomposition products; this can be done by careful heating in air or by heating in an inert atmosphere. Preferably, the heating should be in the range of from about 400° C. to about 800° C. for a time in the range of from at least about 10 and up to about 150 minutes or longer.

Additionally, the resin removal step may result in increased tensile strength of the resulting article produced from the molding process as compared to a similar method in which the resin is not removed. The resin removal step may also be advantageous because during the expansion step (i.e., intercalation and exfoliation), when the resin is mixed with the intercalation chemicals, it may in certain instances create toxic byproducts.

Thus, by removing the resin before the expansion step a superior product is obtained such as the increased strength characteristics discussed above. The increased strength characteristics are a result of in part because of increased expansion. With the resin present in the particles, expansion may be restricted.

In addition to strength characteristics and environmental concerns, resin may be removed prior to intercalation in view of concerns about the resin possibly creating a run away exothermic reaction with the acid.

In view of the above, preferably a majority of the resin is removed. More preferably, greater than about 75% of the resin is removed. Most preferably, greater than 99% of the resin is removed.

Once the flexible graphite sheet is comminuted, it is formed into the desired shape (i.e., a sheet) and then cured (when resin impregnated) in the preferred embodiment. Alternatively, the sheet can be cured prior to being comminuted, although post-comminution cure is preferred.

Flexible graphite sheet and foil are coherent, with good handling strength, and are suitably compressed by, e.g. compression molding, to a thickness of about 0.025 mm to 3.75 mm and a typical density of about 0.1 to 1.5 grams per cubic centimeter (g/cc). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, or mixtures thereof. Suitable epoxy resin systems include those based on diglycidyl ether or bisphenol A (DGEBA) and other multifunctional resin systems; phenolic resins that can be employed include resole and novolak phenolics.

Although this application is written in terms of the application of heat spreaders to plasma display panels, it will be recognized that the inventive method and heat spreader are equally applicable to other heat sources, or heat source collections, especially those being manufactured in high volume processes. Indeed, the inventive method and heat spreader are equally applicable to display panels other than plasma display panels, usch as liquid crystal displays (LCDs) and the like.

Plasma display panels are now being produced at sizes of 1 meter and above (measured from corner to corner). Thus, heat spreaders used to cool and ameliorate the effects of hot spots on such panels are also required to be relatively large, on the order of about 270 millimeters×about 500 millimeters, or as large as about 800 millimeters×500 millimeters, or even larger. In a plasma display panel, as discussed above, hundreds of thousands of cells, each containing a plasma gas, are present. When a voltage is applied to each cell, the plasma gas then reacts with phosphors in each cell to produce colored light. Since significant power is required to ionize the gas to produce the plasma, the plasma display can become very hot. Moreover, depending on the color in a particular region of the panel, hot spots can be created on the screen which can result in premature breakdown of the phosphors which can shorten display life as well as cause thermal stresses on the panel itself. Therefore, a heat spreader is needed to reduce the effect of these hot spots.

Sheets of compressed particles of exfoliated graphite, especially laminates of sheets of compressed particles of exfoliated graphite, have been found particularly useful as heat spreaders for plasma display panels. In practice, this requires the graphite heat spreaders to be produced with a layer of adhesive thereon to adhere the heat spreader to the plasma display panel, especially during the plasma display panel assembly process. A release liner must then be used to overlay the adhesive, with the adhesive sandwiched between the release liner and the graphite sheet, to permit storage and shipping of the graphite heat spreader prior to adhesion to the plasma display panel.

The use of an adhesive coated graphite sheet (or laminate of sheets) with a release liner has certain requirements which must be met if it is to be practical in a high volume plasma display panel manufacturing process. More particularly, the release liner must be capable of being removed from the sheet at high speed without causing delamination of the graphite. Delamination occurs when the release liner in effect pulls the adhesive and some of the graphite off the sheet as it is being removed, resulting in a loss of graphite, impairment of the graphite sheet itself, and diminution of adhesive needed to adhere the graphite sheet to the plasma display panel, as well as an unsightly and unfortunate appearance.

With that however, though the adhesive and release liner must be selected to permit release of the release liner from the adhesive/graphite sheet without delamination of the graphite, the adhesive must still be strong enough to maintain the graphite sheet in position on the plasma display panel while the panel assumes any of a variety of orientations and to ensure good thermal contact between the heat spreader(s) and the panel.

In addition, significant diminution of the thermal performance of the heat spreader must not be caused by the adhesive. In other words, an adhesive applied in a layer that is of substantial thickness can interfere with the thermal performance of the heat spreader, since the adhesive would interfere with the conduction of heat from the plasma display panel to the heat spreader.

Thus, the adhesive and release liner combination must achieve a balance such that they provide a release load no greater than about 40 g/cm, more preferably about 20 g/cm and most preferably about 10 g/cm, at a release speed of about 1 m/s, as measured, for instance, on a ChemInstruments HSR-1000 high speed release tester. For instance, if it is desired to remove the release liner at a speed of about 1 m/s in order to match the high volume manufacturing requirements of the plasma display panel, the average release load of the release liner should be no greater than about 40 g/cm, more advantageously, about 20 g/cm, and most advantageously about 10 g/cm, in order to permit removal of the release liner without causing graphite delamination at that release speed. To achieve this, the adhesive should most preferably be no greater than about 0.3 mils in thickness.

Another factor to be balanced is the adhesion strength of the adhesive which as noted above, must be sufficient to maintain the heat spreader in position on the plasma display panel during the plasma display panel manufacturing process and to ensure good thermal contact between the heat spreader and the plasma display panel. In order to achieve the required adhesion, the adhesive must have a minimum lap shear adhesion strength of at least about 125 g/cm$^2$, more preferably an average lap shear adhesion strength of at least about 700 g/cm$^2$, as measured, for instance, on a ChemInstruments TT-1000 tensile tester.

With all that, as noted above, the adhesive must not substantially interfere with the thermal performance of the heat spreader. By this is meant, the presence of the adhesive should not result in an increase in the through-thickness thermal resistance of the heat spreader of more than about 100% as compared to the heat spreader material itself, without adhesive. Indeed, in the more preferred embodiment, the adhesive will not lead to an increase in the thermal resistance of more than about 35% as compared to the heat spreader material without adhesive. Thus, the adhesive must meet the release load requirements and average lap shear adhesion strength requirement while being thin enough to avoid an undesirably high increase in thermal resistance. In order to do so, the adhesive should be no thicker than about 0.5 mils, more preferably no thicker than about 0.25 mils.

In order to achieve the balancing described above needed for the production of a heat spreader useful for being applied to a plasma display panel in a high volume manufacturing process, where the heat spreader is a sheet or laminate of sheets of compressed particles of exfoliated graphite having a thickness no greater than about 2.0 millimeters and a density between about 1.6 and about 1.9 grams per cubic centimeter, and Aroset 3300 pressure sensitive acrylic adhesive commercially available from Ashland Chemical in the desired thickness combined with a release liner made of silicone-coated Kraft paper such as an L2 release liner commercially available from Sil Tech, a division of Technicote Inc., can achieve the desired results. Thus, a heat spreader composite is provided which comprises a heat spreader material such as a shear or laminate of shears of compressed particles of exfoliated graphite, having an adhesive thereon in a thickness such that the thermal performance of the heat spreader material is not substantially compromised, with a release layer positioned such that the adhesive is sandwiched between the heat spreader material and the release material. In operation then, the release material can be removed from the heat spreader/adhesive combination and the heat spreader material/adhesive combination then applied to a plasma display panel such that the adhesive adheres the heat spreader material to the plasma display panel. Furthermore, when a plurality of plasma display panels is being produced, the at least one of the heat spreader/adhesive combinations is applied to each of the plurality of plasma display panels.

In this manner, a superior heat spreader for plasma display panels is provided in a manner such that high volume manufacturing of the plasma display panels can be continued while the heat spreader is supplied and applied to the panels.

In order to facilitate a more complete understanding of the invention, a number of examples are provided below. However, the scope of the invention is not limited to the specific embodiments disclosed in these examples which are for purposes of illustration only. All proportions and quantities referred to in the following examples are by weight unless otherwise stated.

Example 1

High speed release liner tests were performed using a ChemInstruments HSR-1000 high speed release tester. The test conditions were such that the drive wheel speed was set at 400, 800 feet/minute, a release angle of 180 degrees, surface release speed of 40, 80 inches/second, a spreader release rate of 0.5, 0.25 seconds and a sample size of 2 inches by 8 inches.

The diagram of the high speed release test is shown in FIG. 1. The release liner 20 is peeled back slightly from one end exposing of the sample exposing the graphite heat spreader 10 and the release liner 20. The exposed end of the graphite 10 is firmly held in place with a clamp 100 while a paper trailer 110 is attached to the free end of release liner 20. Paper trailer 110 is then double backed on itself and is fed between a drive wheel 120 and an idler wheel 125. The test involves driving the drive wheel 120 at a set speed and pressed against paper trailer 20, which is supported by idler wheel 125 illustrated in FIG. 2. Trailer 20, driven by driver wheel 120 moves at the same speed as drive wheel 120 pulling release liner 20 from graphite shear 10.

Because paper trailer 110 is double backed on itself, liner 20 is removed from graphite shear 10 at a release angle of approximately 180 degrees. This causes the adhesive interface to move along the surface of graphite sample 10 at one half the speed of paper trailer 110. As noted, tests were conducted at drive wheel 120 speeds of 400 and 800 feet per minute, corresponding to interface release speeds of 40 and 80 inches per second. In turn, these speeds correspond to a release liner release speed of 0.5 and 0.25 seconds, respectively.

During each test, the maximum release force was recorded, in grams per 2 inch width of sample. After testing, each sample was inspected for signs of graphite delamination, raised areas of graphite, or graphite transfers to the release liner. A sample failed the test if any large raised areas of graphite were observed or if there was any delamination of the graphite. Results are set out in Table I for 2 different adhesive compositions.

As shown in Table I, a total of 199 samples of eGraf 755 graphite heat spreader material, coated with Aroset 3250 adhesive were tested at a release rate if 0.5 seconds. 163 passed the test while 36 failed, for a passing rate of 82%. The average of the maximum release force measured on the samples that failed was 154 grams per 2 inch width, while the average of those that passed was 42 grams per 2 inch width.

A total of 12 samples coated with Aroset 3300 adhesive were tested, 8 at a release rate of 0.5 seconds and 4 at a release rate of 0.25 seconds. In both cases all samples passed. The average of the maximum release force measured on those tested at the slower rate was only 17.4 grams per 2 inch width while for the faster rate, the average was only 19.7 grams per 2 inch width.

Example 2

Lap shear adhesion tests were performed using Chem Instruments TT-1000 tensile tester. Test conditions were set such that crosshead speed is 0.5 inches/minute, lap shear area size is 1" by 1". eGraf specimen size was 1" wide by 4" long. Test substrate material glass and test substrate size 2" wide by 4" long. Specimens were die cut from each sample shear after affixing the sample to the glass substrate, a 1,000 gram weight was applied to the graphite/glass joint on the graphite side for 20 minutes prior to testing. No other forces were applied to the joint.

Samples were assembled in the tensile tester with the glass substrate located in the upper jaw and the sample located in the lower jaw. Tests were conducted at a crosshead speed of 0.5" per minute. Maximum lap shear were obtained for each sample and are summarized in table II.

As shown in Table II, 100 samples of eGraf 755 graphite heat spreader coated with Aroset 3250 adhesive were tested, along with 10 samples of eGraf 755 heat spreader coated with Aroset 3300 adhesive. The average of the maximum lap shear strengths for the Aroset 3250 adhesive coated samples was 4129 grams while the average for the Aroset 3300 adhesive coated samples was 3738 grams. The standard deviation for the Aroset 3250 adhesive samples was 1422 grams or that of the Aroset 3300 adhesive samples was 1822 grams. Thus, there is on average a 10 percent reduction in the lap shear strength when the Aroset 3300 adhesive is employed.

Example 3

Probe tack tests were performed using a ChemInstruments PT-1000 Probe Tack Tester. Probe tack measures the initial "grab" of the adhesive on a substrate under no load conditions. Probe tack loads were obtained for samples of eGraf 755 graphite heat spreader coated with Aroset 3250 adhesive and Aroset 3300 adhesive, respectively and the results are summarized in Table III.

As shown in Table III, Probe Tack Tests were carried out on 26 samples coated with Aroset 3250 adhesive and 16 samples coated with Aroset 3300 adhesive. The Aroset 3250 samples came from 3 spreaders while the Aroset 3300 samples came from 2 spreaders. The average of the Probe tack loads for the Aroset 3250 adhesive coated samples was 23 grams while the average for the Aroset 3300 adhesive coated samples was 19.1 grams. The standard deviation for the Aroset 3250 coated samples was 10.5 grams while that for the Aroset 3300 adhesive coated samples was 9.0 grams, indicating that on average, there is a 17% reduction in probe tack load for the 3300 adhesive compared to the Aroset 3250 adhesive.

Example 4

Thru thickness thermal resistant tests were performed using the modified ASTM D5470 Thermal Conductivity Test. The tests were carried out on eGraf graphite heat spreader without adhesive and eGraf 755 heat spreader with either Aroset 3250 adhesive or Aroset 3300 adhesive applied to one side only. Two samples of each material were tested. The samples were 2.0 inches in diameter and tests were conducted at a contact pressure of 16 psi and a nominal specimen temperature of 50° C. Test results are summarized in Table IV. As shown, eGraf 755 material without adhesive had a thermal resistance of 3.48 cm$^{2○}$ C./W. The sample coated with Aroset 3250 had a thermal resistance which varied between 4.46 and 4.55 cm$^{2○}$ C./W. while that of the sample coated with Aroset 3300 adhesive varied between 3.77 and 3.99 cm$^{2○}$ C./W, indicating that the thermal performance of the Aroset 3300 adhesive coated sample is substantially better than that of the Aroset 3250 adhesive coated sample.

The foregoing examples illustrate the balancing tests which need to be used to identify acceptable release liners and adhesives for use with heat spreader materials in order to accomplish the balanced heat spreader composite of the present invention.

All cited patents and publications referred to in this application are incorporated by reference.

The invention thus being described, it will obvious that it may be varied in many ways. Such variations are not to be regarded as a departure from the spirit and scope of the present invention and all such modifications as would be obvious to one skilled in the art are intended to be included in the scope of the following claims.

The invention claimed is:

1. A method for cooling a collection of light-emitting heat sources in a liquid crystal display panel by applying a heat spreader thereto, the method comprising (a) providing an anisotropic heat spreader composite having two major surfaces and a thickness between the major surfaces, which comprises a heat spreader material comprising at least one sheet of compressed particles of exfoliated graphite, each heat spreader composite having an adhesive thereon and a release material positioned such that the adhesive is sandwiched between the heat spreader material and the release material, wherein the adhesive achieves a minimum lap shear adhesion strength of at least about 125 grams per square centimeter; (b) removing the release material from the composite; and (c) applying the composite to a liquid crystal display panel such that the adhesive adheres the heat spreader composite to the panel ensuring direct thermal contact between the heat spreader and the collection of light-emitting heat sources in the panel while the panel assumes any of a variety of orientations, wherein the heat spreader cools the collection of light-emitting heat sources in the liquid crystal display panel.

2. The method of claim 1 wherein the adhesive and release material provide an average release load of no greater than about 40 grams per centimeter at a release speed of one meter per second.

3. The method of claim 2 wherein the average release load is no greater than about 10 grams per centimeter at a release speed of one meter per second.

4. The method of claim 1 wherein the adhesive achieves an average lap shear adhesion strength of at least about 700 grams per square centimeter.

5. The method of claim 1 wherein the adhesive results in an increase in through thickness thermal resistance of the adhesive/heat spreader material of not more than about 35% as compared to the heat spreader material itself.

6. The method of claim 5 wherein the thickness of the adhesive is no greater than about 0.5 mils.

7. The method of claim 6 wherein the thickness of the adhesive is not greater than about 0.25 mils.

8. The method of claim 1 wherein the heat spreader material comprises a laminate comprising a plurality of sheets of compressed particles of exfoliated graphite.

9. A method for applying heat spreaders to a plurality of liquid crystal display panels which comprise a collection of light-emitting heat sources, the method comprising (a) providing a plurality of anisotropic heat spreader composites, each of which comprises a heat spreader material comprising at least one sheet of compressed particles of exfoliated graphite, the heat spreader composites each having an adhesive thereon and a release material positioned such that the adhesive is sandwiched between the heat spreader material and the release material, wherein the adhesive achieves a minimum lap shear adhesion strength of at least about 125 grams per square centimeter and no primer coating is required for adhesion of the adhesive to the heat spreader material; (b) removing the release material from a plurality of the composites; and (c) applying at least one of the composites to each of the plurality of liquid crystal display panels each such that the adhesive adheres the heat spreader composite to the liquid crystal display panel such that the heat spreader composite is in direct thermal contact with the collection of light-emitting heat sources in the liquid crystal display panel and cools and ameliorates the effects of hot spots generated by the panel.

10. The method of claim 9 wherein the release material and adhesive are selected to permit a predetermined rate of release of the release material without causing undesirable damage to the heat spreader material.

11. The method of claim 10 wherein the adhesive and release material provide an average release load of no greater than about 40 grams per centimeter at a release speed of one meter per second.

12. The method of claim 11 wherein the average release load is no greater than about 10 grams per centimeter at a release speed of one meter per second.

13. The method of claim 9 wherein the adhesive achieves an average lap shear adhesion strength of at least about 700 grams per square centimeter.

14. The method of claim 9 wherein the adhesive results in an increase in through thickness thermal resistance of the adhesive/heat spreader material of not more than about 35% as compared to the heat spreader material itself.

15. The method of claim 14 wherein the thickness of the adhesive is no greater than about 0.5 mils.

16. The method of claim 15 wherein the thickness of the adhesive is no greater than about 0.25 mils.

17. The method of claim 9 wherein the heat spreader material comprises a laminate comprising a plurality of sheets of compressed particles of exfoliated graphite.

* * * * *